US012696538B2

(12) United States Patent
Herrmann et al.

(10) Patent No.: US 12,696,538 B2
(45) Date of Patent: Jul. 28, 2026

(54) STRUCTURE INCLUDING TRANSISTOR USING BURIED INSULATOR LAYER AS GATE DIELECTRIC AND TRENCH ISOLATIONS IN SOURCE AND DRAIN

(71) Applicant: GlobalFoundries U.S. Inc., Malta, NY (US)

(72) Inventors: Tom Herrmann, Dresden (DE); Zhixing Zhao, Dresden (DE); Alban Zaka, Dresden (DE); Yiching Chen, San Jose, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 338 days.

(21) Appl. No.: 18/493,081

(22) Filed: Oct. 24, 2023

(65) Prior Publication Data

US 2024/0055434 A1     Feb. 15, 2024

Related U.S. Application Data

(62) Division of application No. 17/644,858, filed on Dec. 17, 2021, now Pat. No. 11,837,605.

(51) Int. Cl.
*H10D 86/00*     (2025.01)
*H10D 30/63*     (2025.01)
(Continued)

(52) U.S. Cl.
CPC ......... *H10D 86/201* (2025.01); *H10D 30/637* (2025.01); *H10D 62/116* (2025.01); *H10D 86/01* (2025.01)

(58) Field of Classification Search
CPC ..... H10D 86/201; H10D 62/116; H10D 86/01
(Continued)

(56) References Cited

U.S. PATENT DOCUMENTS 7,939,395 B2     5/2011  Abadeer et al.
8,399,927 B2 *   3/2013  Ding ...................... H10D 87/00
                                                                257/351
(Continued)

FOREIGN PATENT DOCUMENTS

CN          105990374 A     10/2016
CN          213459738 U      6/2021
(Continued)

OTHER PUBLICATIONS

Kim et al., "High-Voltage Power Integrated Circuit Technology Using SOI for Driving Plasma Display Panels," IEEE Transactions on Electron Devices, 48:1256-63, Jun. 2001, 8 pages.
(Continued)

*Primary Examiner* — Xia L Cross
(74) *Attorney, Agent, or Firm* — Francois Pagette; Hoffman Warnick LLC

(57)          ABSTRACT

A structure including a semiconductor-on-insulator (SOI) substrate including a semiconductor-on-insulator (SOI) layer over a buried insulator layer over a base semiconductor layer. The structure further includes a first field effect transistor (FET) adjacent to a second FET, the first FET having a gate electrode on the buried insulator layer and a source and a drain in the base semiconductor layer under the buried insulator layer. The second FET has a source and a drain over the buried insulator layer. The structure further includes a trench isolation in each of the source and the drain of the first FET, the source of the first FET surrounding the trench isolation therein and the drain of the first FET surrounding the trench isolation therein.

14 Claims, 7 Drawing Sheets

(51) Int. Cl.
   *H10D 62/10* (2025.01)
   *H10D 86/01* (2025.01)

(58) Field of Classification Search
   USPC ........................................................ 257/347
   See application file for complete search history.

(56) References Cited

U.S. PATENT DOCUMENTS

| | | | |
|---|---|---|---|
| 10,170,614 | B2 | 1/2019 | Schippel et al. |
| 10,991,723 | B2 | 4/2021 | Gocho |
| 11,837,605 | B2 | 12/2023 | Herrmann et al. |
| 2006/0278924 | A1 | 12/2006 | Kao |
| 2008/0220580 | A1 | 9/2008 | Kato et al. |
| 2009/0140334 | A1 | 6/2009 | Chang |
| 2010/0213545 | A1 | 8/2010 | Kho et al. |
| 2011/0049594 | A1 | 3/2011 | Dyer et al. |
| 2014/0073130 | A1 | 3/2014 | Hilscher et al. |
| 2015/0380543 | A1* | 12/2015 | Zink .................... H10D 30/665 257/334 |
| 2019/0198876 | A1 | 6/2019 | Smith et al. |
| 2021/0210630 | A1 | 7/2021 | Li et al. |

FOREIGN PATENT DOCUMENTS

| | | |
|---|---|---|
| DE | 112018001136 T5 | 11/2019 |
| JP | 2013183154 A | 9/2013 |
| JP | 2017212468 A | 11/2017 |
| KR | 20220161699 A | 12/2022 |
| TW | 200614506 A | 5/2006 |

OTHER PUBLICATIONS

Liang et al., "A 200-V SOI p-Channel LDMOS with thick gate oxide layer," IEEE International Electronics Conference (INEC), 2016, downloaded from IEEE Xplore, 2 pages.

Šonský et al., "Towards universal and voltage-scalable high gate- and drain-voltage MOSFETs in CMOS," ISPSD 2009, downloaded from IEEE Xplore, 4 pages.

Notice of Allowance mailed Aug. 30, 2023 for U.S. Appl. No. 17/644,858, filed Dec. 17, 2021; pp. 12.

Office Action for Taiwan Application 111143900; pp. 6.

Ex Parte Quayle Action mailed Apr. 13, 2023 for U.S. Appl. No. 17/644,858, filed Dec. 17, 2021; pp. 11.

Restriction Requirement mailed Jan. 5, 2023 for U.S. Appl. No. 17/644,858, filed Dec. 17, 2021; pp. 8.

Restriction Response filed Jan. 13, 2023 for U.S. Appl. No. 17/644,858; pp. 9.

ExParte Quayle Response filed Jun. 8, 2023 for U.S. Appl. No. 17/644,858, filed Dec. 17, 2021; pp. 4.

* cited by examiner

STRUCTURE INCLUDING TRANSISTOR USING BURIED INSULATOR LAYER AS GATE DIELECTRIC AND TRENCH ISOLATIONS IN SOURCE AND DRAIN

The present application is a divisional of U.S. patent application Ser. No. 17/644,858, filed Dec. 17, 2021, currently pending. The entire contents of the foregoing is incorporated herein by reference.

BACKGROUND

The present disclosure relates to integrated circuits, and more specifically, to a structure including a high performance or lower power transistor and a high voltage transistor on a semiconductor-on-insulator substrate. The high voltage transistor has a gate electrode on the buried insulator layer, a source and a drain in the base semiconductor layer, and trench isolations in the source and drain.

Integrated circuit (IC) structures are increasingly incorporating high-voltage transistors with high performance, low-voltage transistors. In fully-depleted semiconductor-on-insulator (FDSOI) substrates, it is challenging to form high-voltage transistors that are compatible with the fabrication processes for low-voltage transistors. The additional processing that is required to form the high-voltage transistors on FDSOI substrates increases the time and cost of fabrication of these IC structures.

SUMMARY

An aspect of the disclosure is directed to a structure, comprising: a semiconductor-on-insulator (SOI) substrate including a semiconductor-on-insulator (SOI) layer over a buried insulator layer over a base semiconductor layer; a first field effect transistor (FET) adjacent to a second FET, the first FET having a gate electrode on the buried insulator layer and a source and a drain in the base semiconductor layer under the buried insulator layer, the second FET having a source and a drain over the buried insulator layer; and a trench isolation in each of the source and the drain of the first FET, the source of the first FET surrounding the trench isolation therein.

Another aspect of the disclosure includes a structure, comprising: a trench isolation layer in a base semiconductor layer in a first region, and a semiconductor-on-insulator (SOI) substrate in a second region; a first field effect transistor (FET) in the first region adjacent to a second FET in the second region, the first FET having a source and a drain in the base semiconductor layer under the trench isolation layer and a gate electrode over the trench isolation layer over the base semiconductor layer, the second FET having a source and a drain in a semiconductor-on-insulator (SOI) layer over a buried insulator layer of the SOI substrate; and a deep trench isolation in each of the source and the drain of the first FET, the deep trench isolations integral to the trench isolation layer, the source of the first FET surrounding the deep trench isolation therein.

Another aspect of the disclosure includes a structure, comprising: a semiconductor-on-insulator (SOI) substrate including a semiconductor-on-insulator (SOI) layer over a buried insulator layer over a base semiconductor layer; a first field effect transistor (FET) adjacent to a second FET, the first FET having a gate electrode on the buried insulator layer and a source and a drain in the base semiconductor layer under the buried insulator layer, the second FET having a source and a drain over the buried insulator layer;

a trench isolation in each of the source and the drain of the first FET, the source of the first FET surrounding the trench isolation therein and the drain of the first FET surrounding the trench isolation therein.

An aspect of the disclosure related to a method, comprising: in a fully-depleted semiconductor-on-insulator (FDSOI) substrate including a semiconductor-on-insulator (SOI) layer over a buried insulator layer over a base semiconductor layer, forming a first field effect transistor (FET) in a first region of the FDSOI substrate before forming a first trench isolation and a second trench isolation spaced from the first trench isolation in the base semiconductor layer; doping the base semiconductor layer to form a source about the first trench isolation and a drain about the second trench isolation, the source of the first FET surrounding the first trench isolation therein; epitaxially growing a semiconductor region over the SOI layer; and forming a gate electrode in the semiconductor region and the SOI layer using the buried insulator layer as a gate dielectric for the gate electrode.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
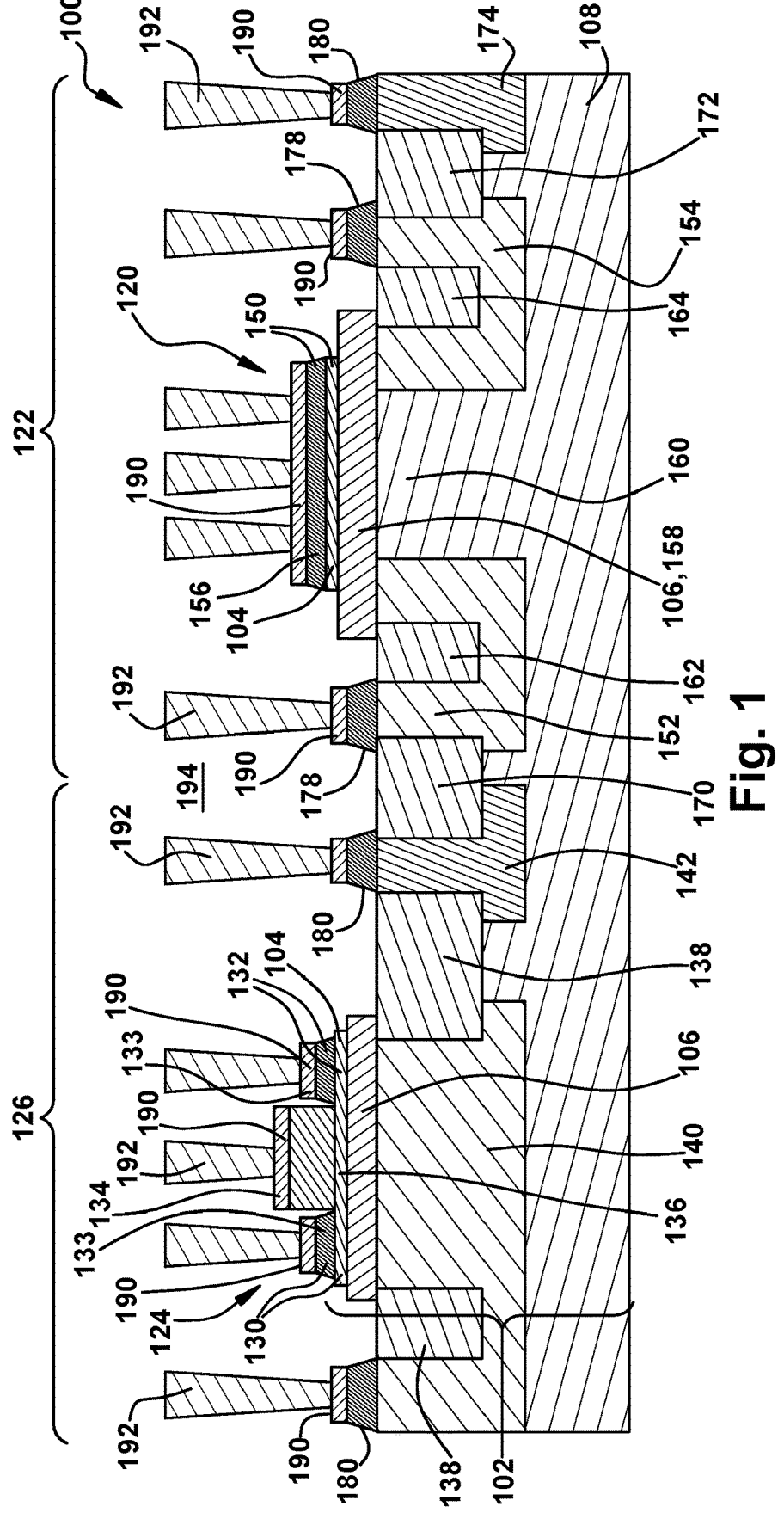
FIG. 1 shows a cross-sectional view of a structure including a low voltage FET and a high voltage FET, the latter using a buried insulator layer as a gate dielectric, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure including a semiconductor-on-insulator (SOI) substrate. The SOI substrate includes an SOI layer over a buried insulator layer over a base semiconductor layer. The structure includes a high-voltage first field effect transistor (FET) adjacent to a high performance, low voltage second FET. The high voltage FET has a gate electrode on the buried insulator layer, and a source and a drain in the base semiconductor layer under the buried insulator layer. Hence, the buried insulator layer operates as a gate dielectric for the high voltage FET. The low voltage FET has a source and a drain over the buried insulator layer, i.e., in the SOI layer. A trench isolation is in each of the source and the drain of the first, high voltage FET. In this manner, the source of the high voltage FET surrounds the trench isolation therein and the drain of the high voltage FET surrounds the trench isolation therein. The SOI substrate can be a fully depleted SOI substrate (FDSOI) indicating that it uses an ultra-thin buried insulator layer (or buried oxide (BOX)) positioned on top of the base semiconductor substrate, and a very thin SOI layer over the buried insulator layer that provides the transistor channel, i.e., for the high performance low voltage FET. The ultra-thin SOI layer does not need to be doped to create the channel, thus making the transistor "fully depleted."

Embodiments of the disclosure provide high voltage FETs with high performance, low voltage FETs using processes that are fully compatible on FDSOI technology and with no additional masks required, meaning the structure does not present additional costs. The high voltage FET can operate up to, for example, 25 Volts. This structure also simplifies high voltage application designs in analog circuitry such as analog switches, digital voltage level shifter and op-amp circuit design.

FIG. 1 shows cross-sectional view of a structure 100 according to embodiments of the disclosure. Structure 100 includes a semiconductor-on-insulator (SOI) substrate 102 including an SOI layer 104 over a buried insulator layer 106 over a base semiconductor layer 108. SOI layer 104 and base semiconductor layer 108 can include, for example, silicon, silicon germanium, germanium, or other semiconductor material. Buried insulator layer 106 may include any appropriate dielectric such as but not limited to silicon oxide.

Structure 100 also includes a first field effect transistor (FET) 120 in a first region 122 of SOI substrate 102 adjacent to a second FET 124 in a second region 126 of SOI substrate 102. First FET 120 is a high voltage transistor, and second FET 124 is a high performance, low voltage transistor. Hence, first FET 120 operates at a higher voltage than second FET 124. In one non-limiting example, first FET 120 may operate at a voltage ($V_{DD}$) of up to 10 Volts (V), while second FET 124 operates at a voltage ($V_{DD}$) of lower than 4 V. (Threshold voltages (Vt) of first FET 120 and second FET 124 may be, for example, approximately 1V and less than approximately 0.5V, respectively). Hereafter, first FET 120 will be referred to as "high voltage FET 120," and second FET 124 will be referenced as "low voltage FET 124."

Low voltage FET 124 may include any now known or later developed transistor formed over SOI substrate 102. Low voltage FET 124 has a source 130 and a drain 132 over buried insulator layer 106, i.e., in SOI layer 104. Source 130 and drain 132 of low voltage FET 124 are positioned at least in part in SOI layer 104. As shown, source/drain 130, 132 may also include epitaxial raised semiconductor regions 133. Source/drain 130, 132 of low voltage FET 124 may include any appropriate dopants for the desired polarity for the FET, e.g., n-type dopants for an nFET. Low voltage FET 124 also includes a gate electrode 134 over SOI layer 104, creating a channel 136 in SOI layer 104. SOI layer 104 may be shaped into a fin, and gate electrode 134 may surround the fin.

Gate electrode 134 may include any now known or later developed gate materials. In one example, gate electrode 134 may include a high dielectric constant metal gate (HKMG). Gate electrode 134 may include one or more conductive components for providing a gate terminal of a transistor. For example, gate electrode 134 may include a high dielectric constant (high-K) layer, a work function metal layer, and a gate conductor (not all shown for clarity). The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (also not shown) of, for example, a nitride may also be formed over gate electrode 134.

Low voltage FET 124 is isolated from other devices by trench isolations 138. Various wells 140 may be formed in base semiconductor layer 108 to allow better control of the threshold voltage of low voltage FET 124, e.g., by application of a back bias. A well tap 142 to contact base semiconductor layer 108 may also be formed.

High voltage FET 120 is structured differently than low voltage FET 124 to allow operation at a higher voltage. High voltage FET 120 has a gate electrode 150 on buried insulator layer 106 and has a source 152 and a drain 154 in base semiconductor layer 108 under buried insulator layer 106. Buried insulator layer 106 in high and low voltage FETs 120, 124 is the same layer, meaning it has a same composition and a same thickness in high voltage FET 120 and low voltage FET 124. Source/drain 152, 154 of high voltage FET 120 may include any appropriate dopants for the desired polarity of high voltage FET 120, e.g., n-type dopants for a nFET.

In FIG. 1, gate electrode 150 of high voltage FET 120 includes an epitaxial semiconductor layer 156 over SOI layer 104. Epitaxial semiconductor layer 156 and SOI layer 104 of gate electrode 150 may include any appropriate doping. Buried insulator layer 106 provides a gate dielectric 158 for gate electrode 150 with a channel 160 thereof in base semiconductor layer 108. Gate electrode 150 of high voltage FET 120 may overlap both trench isolations 162, 164 in source 152 and drain 154 of high voltage FET 120.

High voltage FET 120 also includes a trench isolation 162, 164 in each of source 152 and drain 154 thereof. Trench isolations (TIs) 162, 164 (first and second TIs) enable high-voltage operation. Drain 154 of high voltage FET 120 surrounds trench isolation 164 therein, and source 152 of high voltage FET 120 surrounds trench isolation 162 therein. That is, TIs 162, 164 are entirely encircled by the doped portions of base semiconductor layer 108 that provide source 152 and drain 154.

High voltage FET 120 is isolated from other devices by additional (third and fourth) trench isolations (TIs) 170, 172. Various wells 140, 142, 174 may be formed in base semiconductor layer 108. Well taps 142, 174 may be formed to contact base semiconductor layer 108. Other wells (not shown) may be provided in first region 122, for example, to provide an extended-junction (similar to lightly doped drain (LDD) implants) for better control of the threshold voltage of high voltage FET 120, e.g., by application of a back bias.

FIGS. 2-5 show cross-sectional views of a method of forming structure 100. Generally, high voltage FET 120 and low voltage FET 124 are formed at the same time. First, high voltage FET 120 forming occurs in first region 122 of SOI substrate 102, and second, low voltage FET 124 forming occurs in second region 126 of SOI substrate 102. Second region 126 of SOI substrate 102 may be adjacent to and electrically isolated from first region 122, e.g., by a trench isolation 170.

Figure 2:
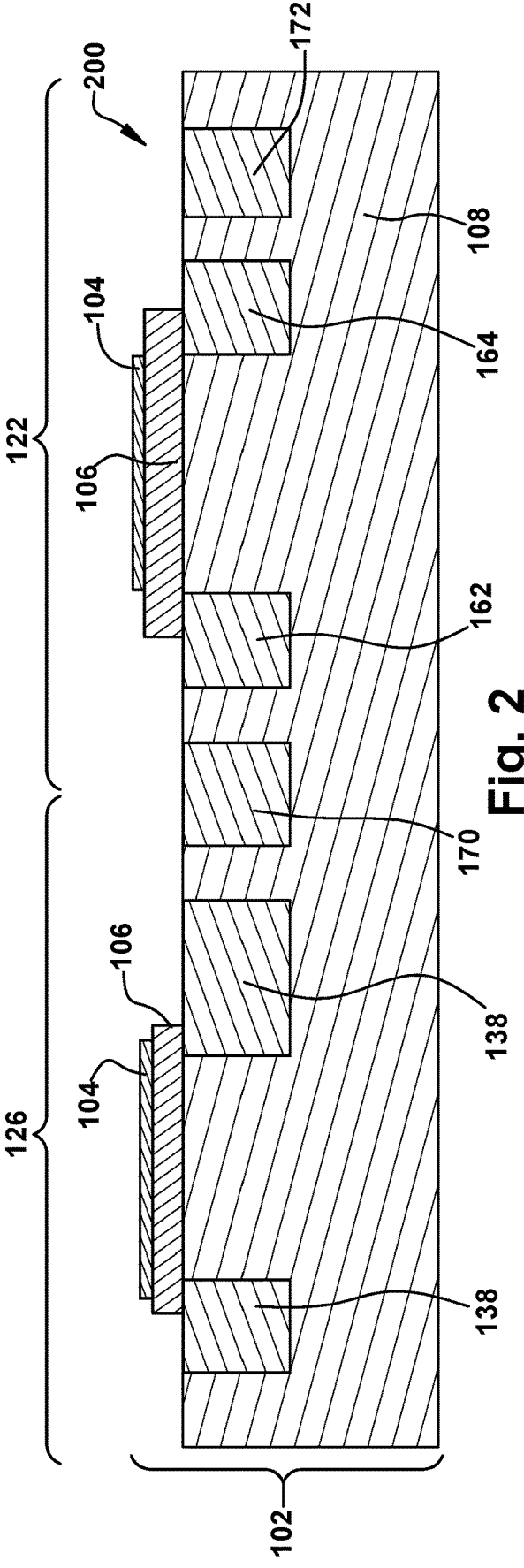
FIG. 2 shows a cross-sectional view of a preliminary structure including trench isolations for a method, according to embodiments of the disclosure.

FIG. 2 shows a preliminary structure 200 of the method after some initial processing. The process begins with SOI substrate 102, which may include a fully-depleted semiconductor-on-insulator substrate including SOI layer 104 over buried insulator layer 106 over base semiconductor layer 108. In FIG. 2, additional processing has already occurred on SOI substrate 102. More particularly, SOI substrate 102 has TIs 138 (2), 170, 162, 164, 172 formed therein. TIs may be formed using any now known or later developed process. For example, various trenches (not labeled) may be formed through SOI substrate 102, using a mask and an etching process. The etching removes SOI layer 104 and buried insulator layer 106 and parts of base semiconductor layer 108. Notably, the etching removes buried insulator layer 106 over areas that will be source 152 and drain 154 of high voltage FET 120 in FIG. 3. The trenches can then be filled with a dielectric such as silicon oxide. Overfill and etch back of the dielectric deposited in the trenches may cause buried insulator layer 106, which often includes the same material as the TIs, to extend over TIs 138, 170, 162, 164, 172 when they are completed. SOI layer 104 and buried insulator layer 106 may also be removed in other areas where they are not necessary during this process. Hence, forming first, high voltage FET 120 (FIG. 1) occurs in first region 122 of FDSOI substrate 102 by forming first TI 162 and second TI 164 spaced from first TI 162 in base semiconductor layer 108. TIs 138 for second, low voltage FET 124 (FIG. 1) and additional TIs 170, 172 may be formed at the same time.

Figure 3:
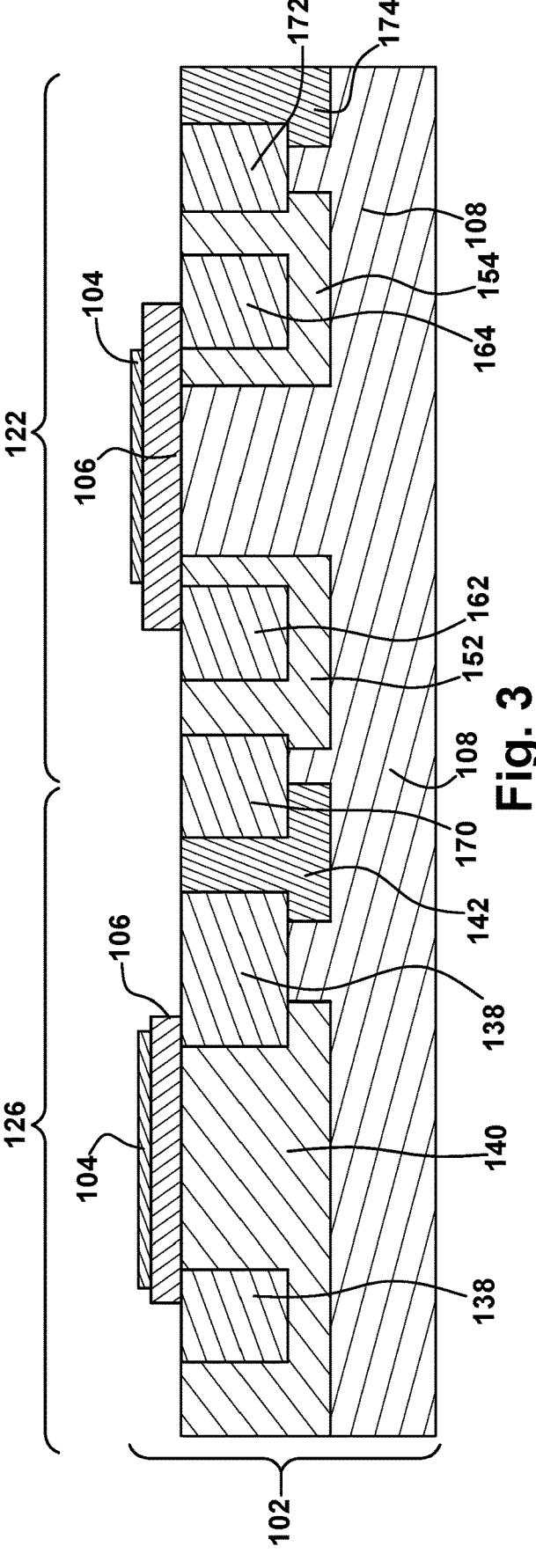
FIG. 3 shows a cross-sectional view of forming wells and source/drain regions for the high voltage FET, according to embodiments of the disclosure.

FIG. 3 shows a cross-sectional view of doping base semiconductor layer 108 to form various parts of FETs 120, 124, e.g., wells and source/drains. Doping may include any now known or later developed processes for injecting a dopant in base semiconductor layer 108, e.g., ion implanting. The types of dopants and dopant concentrations thereof can be selected based on the polarity and performance characteristics desired. Any mask(s) necessary may be used to direct the doping where desired. Any number of doping processes can be performed to achieve the desired doping profiles. For purposes of description, it will be assumed FETs 120, 124 are nFETs, i.e., with n-type doped source/ drains. In first region 122, a source 152 is formed about first TI 162 and a drain 154 is formed about second TI 164. Hence, source 152 of high voltage FET 120 (FIG. 1) surrounds first TI 162 therein and drain 154 of high voltage FET 120 (FIG. 1) may surround second TI 164 therein. Other wells may also be formed during this step. For example, the doping process may also include doping base semiconductor layer 108 below buried insulator layer 106 in second region 126 for low voltage FET 124. This process creates, for example, an n-well 140 in base semiconductor layer 108 in second region 126. Other doping processes may form well taps 142, 174 in first region 122 to contact base semiconductor layer 108. Other wells (not shown) may be formed, for example, to provide an extended-junction for better control of the threshold voltage of high voltage FET 120, e.g., by application of a back bias. Hence, the wells 140 of low voltage FET 124 and source/drain regions 152, 154 and the channel for high voltage FET 120 may be formed in the same process(es).

Figure 4:
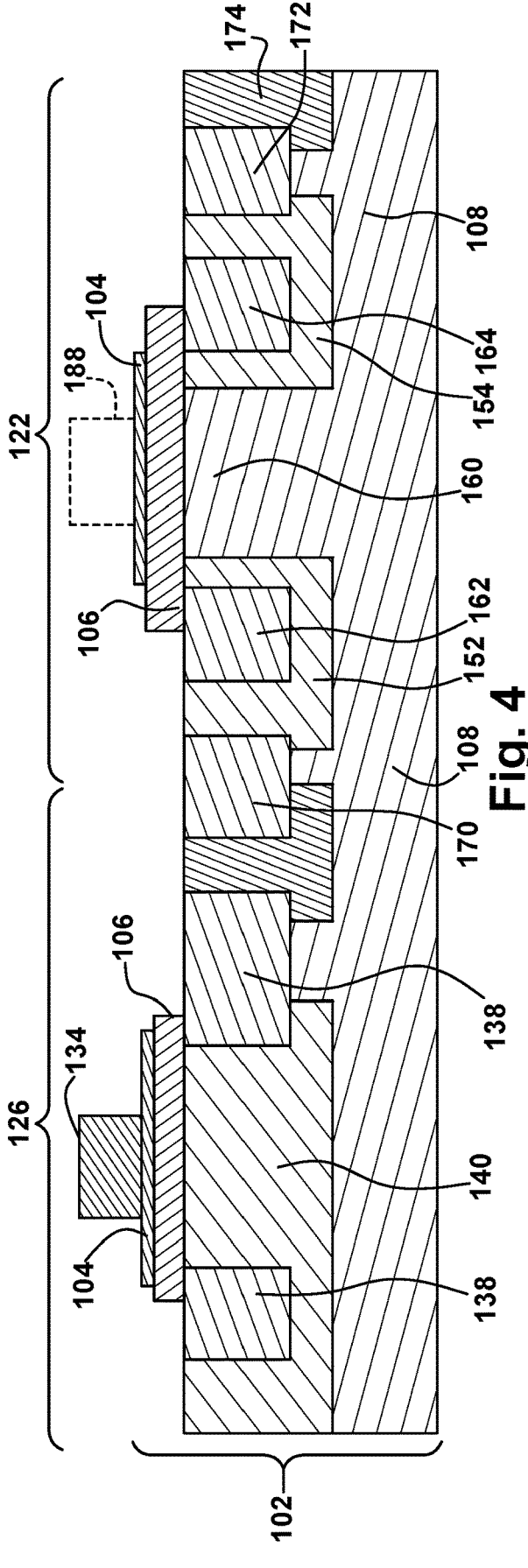
FIG. 4 shows a cross-sectional view of forming a gate electrode for the low voltage FET, according to embodiments of the disclosure.

FIG. 4 shows a cross-sectional view of forming a gate electrode 134 over SOI layer 104 between source 130 and drain 132 of low voltage FET 124. Gate electrode 134 may include any now known or later developed gate materials, as previously described. In one example, gate electrode 134 may include a HKMG, as previously described. Gate electrode material may also be formed over SOI layer 104 in first region 122, and then subsequently removed, e.g., by etching (see dashed box indicating removed gate electrode 188). Gate material may be deposited using any appropriate technique, e.g., atomic layer deposition, and may be patterned using any technique. A replacement metal gate or a gate first approach may be used.

Figure 5:
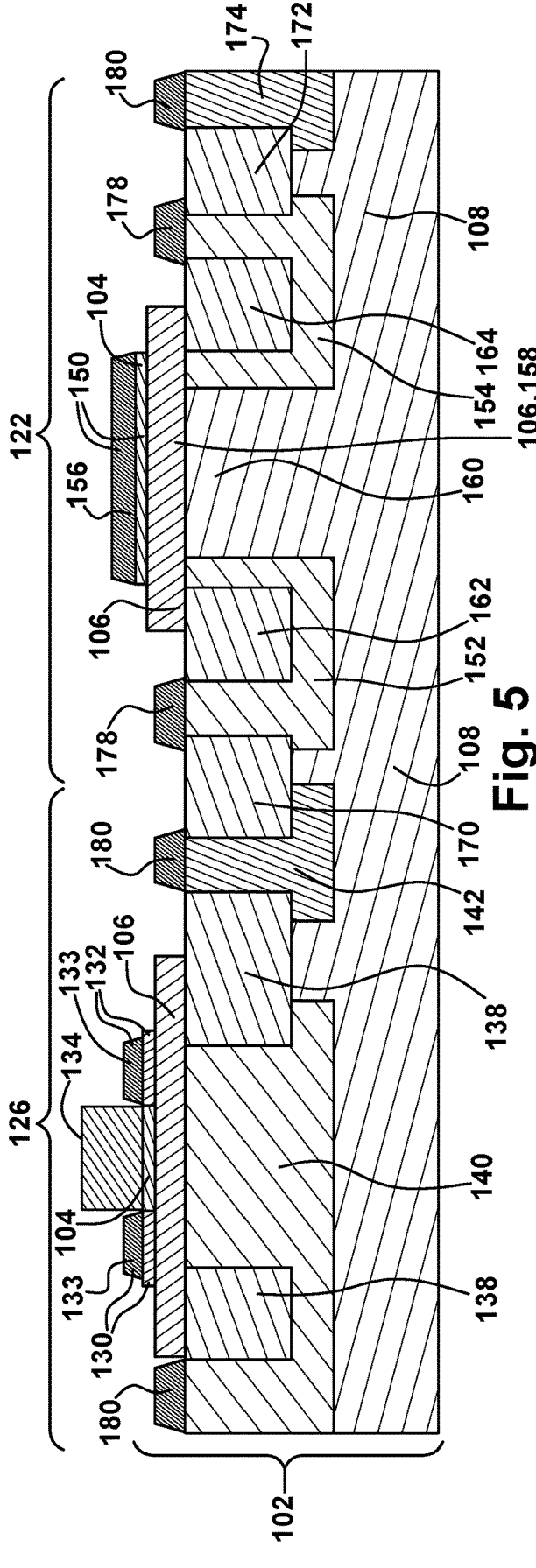
FIG. 5 shows a cross-sectional view of forming a gate electrode for the high voltage FET, according to embodiments of the disclosure.

FIG. 5 shows a cross-sectional view of epitaxially growing a semiconductor region 156 over SOI layer 104 in first region 122. The terms "epitaxial growth" and "epitaxially formed and/or grown" mean the growth of a semiconductor material on a deposition surface of a semiconductor material in which the semiconductor material being grown may have the same crystalline characteristics as the semiconductor material of the deposition surface. FIG. 5 also shows forming gate electrode 150 in semiconductor region 156 and SOI layer 104 using buried insulator layer 106 as gate dielectric 158 for gate electrode 150. Gate electrode 150 formation may include doping semiconductor region 156 and/or SOI layer 104 with an appropriate dopant. As noted regarding FIG. 4, gate electrode 134 formation for low voltage FET 124 may occur before forming gate electrode 150 for high voltage FET 120. In this case, gate electrode 188 (dashed box in FIG. 4) for low voltage FET 124 may be removed from over semiconductor region 156 and SOI layer 104 in first region 122 before forming gate electrode 150 for high voltage FET 120. FIG. 5 also shows epitaxially growing a raised semiconductor region 133 over SOI layer 104 adjacent gate electrode 150. Raised semiconductor region 133 may be doped in any known fashion to create raised source 130 and drain 132 of low voltage FET 124. The epitaxy process may also form raised semiconductor regions 178 for source 152 and drain 154 of high voltage FET 120 (FIG. 1) in first region 122 and raised semiconductor regions 180 for any of the various wells 140, 142, 174. Raised semiconductor regions 133, 178, 180 may include any appropriate dopant. Any necessary spacers (not shown) may be formed at this stage also.

Any now known or later developed semiconductor fabrication process may follow to form interconnect layers to first and second regions 122, 126 and FETs 120, 124. As shown in FIG. 1, a silicide 190 may be simultaneously formed over source 152, drain 154 and gate electrode 150 of high voltage FET 120, and source 130, drain 132 and gate electrode 134 of low voltage FET 124. Silicide 190 may be formed using any now known or later developed technique, e.g., performing an in-situ pre-clean, depositing a metal such as titanium, nickel, cobalt, etc., annealing to have the metal react with silicon, and removing unreacted metal. Any number of contacts 192 may be formed through an interlayer dielectric 194 to the necessary portions of FETs 120, 124.

Figure 6:
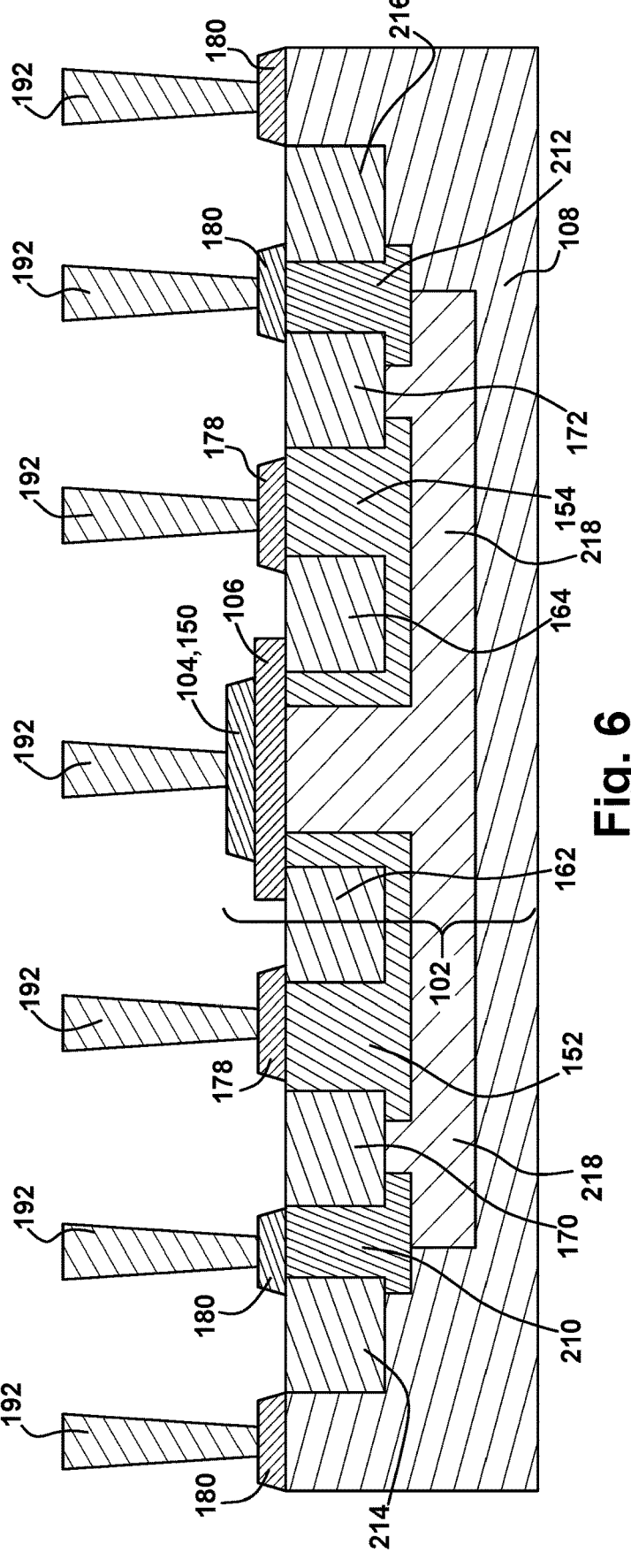
FIG. 6 shows a cross-sectional view of a high voltage FET, according to alternative embodiments of the disclosure.

FIG. 6 shows a cross-sectional view of an alternative embodiment of high voltage FET 120, usable with structure 100 described previously herein. In this embodiment, source 152 and drain 154 of high voltage FET 120 include a p-type dopant, and additional wells are provided to control a threshold voltage of FET 120. In this case, high voltage FET 120 includes an n-type well 210, 212 isolated by a TI 170, 172 adjacent each of source 152 and drain 154 of high voltage FET 120. Because n-type wells 210, 212 may not extend sufficiently deep into base semiconductor layer 108 to provide desired control, high voltage FET 120 may also include a deep n-type well 218 coupling n-type wells 210, 212 in base semiconductor layer 108. In this embodiment, forming TIs as in FIG. 2 would also include forming: (third) TI 170 spaced from (first) TI 162 (within source 152), a (fourth) TI 214 spaced from (third) TI 170, a (fifth) TI 172 spaced from (second) TI 164 (within drain 154), and a (sixth) TI 216 spaced from (fifth) TI 172. The doping as in FIG. 3 would include doping base semiconductor layer 108 with an n-type dopant to form n-type well 210 between TI 170 and TI 214 and n-type well 212 between TI 172 and TI 216. The doping also includes doping to form a deep n-type well 218 in base semiconductor layer 108 coupling n-type wells 210, 212. Any appropriate contacts 192 to the various wells 210, 212 and/or p-type base semiconductor layer 108 can be added.

Figure 7:
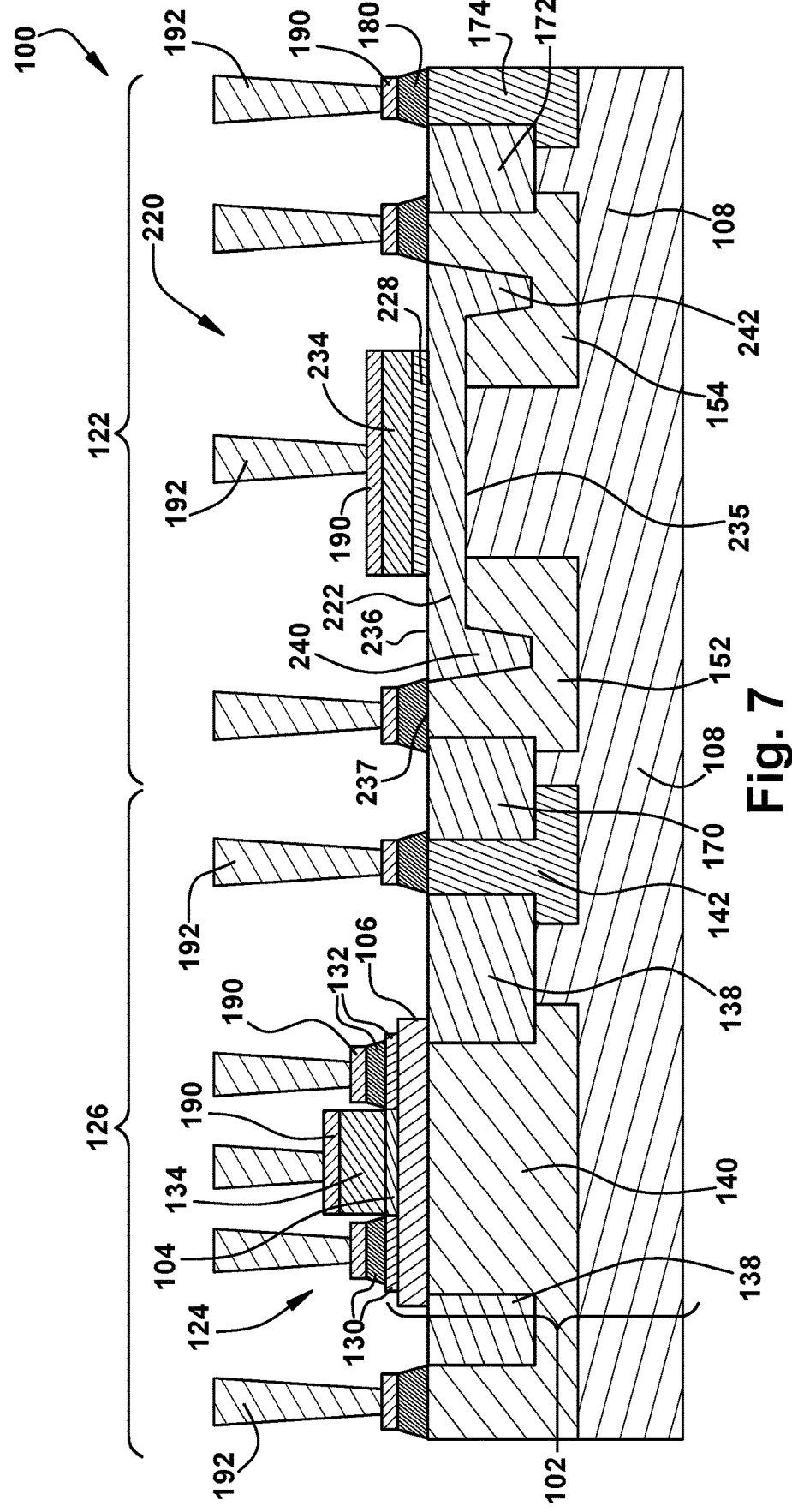
FIG. 7 shows a cross-sectional view of a structure including a low voltage FET and a high voltage FET, the latter using a shallow, shallow trench isolation layer as part of a gate dielectric, according to embodiments of the disclosure.

FIG. 7 shows a cross-sectional view of structure 100 including another alternative embodiment of a high voltage FET 220. In this embodiment, a trench isolation layer 222 replaces buried insulator layer 106 (FIG. 1) under a gate electrode 234 of high voltage FET 120 in first region 122. Gate electrode 234 for high voltage FET 220 is in the form of a HKMG rather than semiconductor as in the FIG. 1 embodiment.

As shown in FIG. 7, structure 100 may include SOI substrate 102, including SOI layer 104 over buried insulator layer 106 over base semiconductor layer 108, in second region 126. Low voltage FET 124 is as described previously herein. Low voltage FET 124 has gate electrode 134 over (semiconductor) SOI layer 104 over buried insulator layer 106 over base semiconductor layer 108. Source 130 and drain 132 of low voltage FET 124 are positioned in (semiconductor layer) SOI layer 104 over buried insulator layer 106. Gate electrode 134 of low voltage FET 124 may include a high dielectric constant metal gate (HKMG) over (semiconductor) SOI layer 104. In contrast, in first region 122, SOI layer 104, and buried insulator layer 106 are removed during formation of trench isolations. In first region 122, a trench isolation layer 222 is in base semiconductor layer 108, and deep trench isolations (DTIs) 240, 242 are coupled thereto and extend into source 152 and drain 154, respectively. Trench isolation layer 222 is formed in a shallow trench 235 such that an upper surface 236 thereof is coplanar with an upper surface 237 of base semiconductor layer 108—in contrast to buried insulator layer 106 which is over base semiconductor layer 108 in second region 126. Trench isolation layer 222 and DTIs 240, 242 may be formed using any now known or later developed (double) trench isolation formation process, e.g., trench formation, dielectric deposition, and planarization. Trench isolation layer 222 may have a thickness of, for example, 20 nanometers (nm) to 50 nm, and may be referred to as "shallow, shallow trench isolation (sSTI)." Trench isolation layer 222 and DTIs 240, 242 may be formed with trench isolations, e.g., TIs 138, 170, 172 (FIG. 2). DTIs 240, 242 extend deeper into base semiconductor layer 108 than trench isolation layer 222. DTIs 240, 242 may also be referred to as "deep fence isolations." DTIs 240, 242 are in source 152 and drain 154, respectively, i.e., source 152 and drain 154 surrounds respective DTIs 240, 242, to create a longer drift region to support a higher drain voltage ($V_{DD}$). The relative locations of junctions of source 152 and drain 154 with base semiconductor layer 108 under gate electrode 234, and the relative location of DTIs 240, 242 in source 152 and drain 154, respectively, can be controlled to obtain desired performance characteristics.

High voltage FET 220 is adjacent to low voltage FET 124, and has source 152 and drain 154 in base semiconductor layer 108 and under trench isolation layer 222. In contrast to structure 100 in FIG. 1, gate electrode 234 of high voltage FET 220 may include a HKMG over trench isolation layer 222 over base semiconductor layer 108. Gate electrode 226 of high voltage FET 220 includes a gate dielectric layer 226 including trench isolation layer 222 and at least one dielectric layer 228 over trench isolation layer 222. That is, gate dielectric layer 226 of gate electrode 234 may include trench isolation layer 222 and one or more dielectric layers 228 over trench isolation layer 222. Dielectric layer(s) 228 may include one or more high-k layers described herein for an HKMG such as but not limited to hafnium oxide and titanium nitride. Gate electrode 234 may include other layers as described herein for an HKMG, e.g., a work function metal and a gate conductor. Gate dielectric layer 226 is over trench isolation layer 222 over base semiconductor layer 108.

As noted, structure 100 in FIG. 7 also includes a DTI 240, 242 in each of source 152 and drain 154 of high voltage FET 220. Source 152 of high voltage FET 220 surrounds DTI 240 therein, and drain 154 of high voltage FET 220 may surround DTI 242 therein. Trench isolation layer 222 may include any appropriate trench isolation dielectric such as silicon oxide. DTIs 240, 242 are integral to trench isolation layer 222, and may include the same material or another dielectric. Trench isolation layer 222 and DTIs 240, 242 may be formed similarly to trench isolations 138, 170, 172. Gate electrode 234 of high voltage FET 220 overlaps both DTIs 240, 242 in source 152 and drain 154 of the FET, respectively.

Embodiments of the disclosure provide a high voltage FETs with a high performance, low voltage FETs using processes that are fully compatible on FDSOI technology and with no additional masks required, meaning the structure is cost neutral. The high voltage FET can operate up to, for example, 10 Volts, with gate-source voltage (Vgs) and gate-drain voltage (Vds) of greater than or equal to 10 V. The high voltage FET also exhibits lower switching time due reduced gate-source, gate-drain, and gate-gate capacitance (Cgs, Cgd and Cgg). The structure also simplifies analog circuit design an analog switch (e.g., reducing an eight transistor device to a two or one transistor device), and certain high-voltage devices such as but not limited to digital voltage level shifter (e.g., reducing an eight transistor device to a four transistor device), and op-amp applications.

The structure and method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a trench isolation layer in a base semiconductor layer in a first region, and a semiconductor-on-insulator (SOI) substrate in a second region;
   a first field effect transistor (FET) in the first region adjacent to a second FET in the second region, the first FET having a source and a drain in the base semiconductor layer under the trench isolation layer and a gate electrode over the trench isolation layer over the base semiconductor layer, the second FET having a source and a drain in a semiconductor-on-insulator (SOI) layer over a buried insulator layer of the SOI substrate; and
   a deep trench isolation in each of the source and the drain of the first FET, the deep trench isolations integral to the trench isolation layer, the source of the first FET surrounding the deep trench isolation therein.

2. The structure of claim 1, wherein the gate electrode of the first FET overlaps both deep trench isolations in the source and the drain of the first FET.

3. The structure of claim 1, wherein the gate electrode of the first FET includes a high dielectric constant metal gate (HKMG) over the trench isolation layer.

4. The structure of claim 1, wherein the second FET includes a gate electrode including a high dielectric constant metal gate (HKMG) over the SOI layer.

5. The structure of claim 1, wherein the gate electrode of the first FET includes a gate dielectric layer including the trench isolation layer and at least one dielectric layer over the trench isolation layer.

6. A structure, comprising:
   a semiconductor-on-insulator (SOI) substrate including a semiconductor-on-insulator (SOI) layer over a buried insulator layer over a base semiconductor layer;

a first field effect transistor (FET) adjacent to a second FET, the first FET having a gate electrode on the buried insulator layer and a source and a drain in the base semiconductor layer under the buried insulator layer, the second FET having a source and a drain over the buried insulator layer; and a pair of well taps on opposing sides of the first FET, wherein at least one of the well taps is T-shaped; and a trench isolation in each of the source and the drain of the first FET, the source of the first FET surrounding the trench isolation therein and the drain of the first FET surrounding the trench isolation therein.

7. The structure of claim 6, wherein one well tap is adjacent the source and the other well tap is adjacent the drain.

8. The structure of claim 6, further comprising a trench isolation between each respective well tap and the respective source and the respective drain.

9. The structure of claim 6, further comprising a gate dielectric including the buried insulator layer and vertically between the gate electrode and the base semiconductor layer.

10. The structure of claim 9, wherein the gate dielectric extends from one trench isolation to the other trench isolation.

11. A method, comprising:

in a semiconductor-on-insulator (SOI) substrate including a semiconductor-on-insulator (SOI) layer over a buried insulator layer over a base semiconductor layer, forming a first field effect transistor (FET) in a first region of the SOI substrate, the first FET being adjacent to a second FET and having a gate electrode on the buried insulator layer and a source and a drain in the base semiconductor layer under the buried insulator layer, the second FET having a source and a drain over the buried insulator layer, wherein forming the first FET includes:

forming a trench isolation in each of the source and the drain of the first FET, the source of the first FET surrounding the trench isolation therein and the drain of the first FET surrounding the trench isolation therein; and forming a pair of well taps on opposing sides of the first FET, wherein at least one of the well taps is T-shaped.

12. The method of claim 11, further comprising forming a second FET in a second region of the SOI substrate adjacent to and electrically isolated from the first region by:

doping the SOI layer to form the source and the drain for the second FET therein, the source and the drain of the second FET being over the buried insulator layer;

forming the gate electrode over the SOI layer between the source and the drain of the second FET.

13. The method of claim 12, wherein forming the gate electrode for the second FET occurs prior to forming the gate electrode for the first FET, and further comprising removing the gate electrode for the second FET from over the semiconductor region and the SOI layer in the first region prior to forming the gate electrode for the first FET.

14. The method of claim 13, further comprising epitaxially growing a raised semiconductor region over each of the source and the drain of the second FET.

* * * * *